Feb. 6, 1962 F. C. KUCH 3,020,510

ELECTRICAL CONNECTOR FOR PREFORMED PANEL CIRCUIT ARRANGEMENTS

Filed Dec. 26, 1957 2 Sheets-Sheet 1

INVENTOR
F. C. KUCH

BY [signature]

ATTORNEY

Feb. 6, 1962 F. C. KUCH 3,020,510

ELECTRICAL CONNECTOR FOR PREFORMED PANEL CIRCUIT ARRANGEMENTS

Filed Dec. 26, 1957 2 Sheets-Sheet 2

INVENTOR
F. C. KUCH
BY B. J. Stoddard.
ATTORNEY

United States Patent Office 3,020,510
Patented Feb. 6, 1962

3,020,510

ELECTRICAL CONNECTOR FOR PREFORMED PANEL CIRCUIT ARRANGEMENTS

Frederick C. Kuch, New Providence, N.J., assignor to Bell Telephone Laboratories, Incorporated, New York, N.Y., a corporation of New York Filed Dec. 26, 1957, Ser. No. 705,456
3 Claims. (Cl. 339—17)

This invention relates to electrical connectors and, more particularly, to electrical connectors for preformed panel circuit arrangements, such as printed circuits.

In general, printed circuits are preformed upon a panel or flat board composed of insulating material. The circuits ordinarily include terminal leads that are printed on one or both sides of a board in parallel spaced relation along one edge of the board. These terminal leads are usually formed with a thin surface plating of precious metal, such as rhodium or gold, for the purpose of providing good electrical conductivity.

In order to connect the terminal leads of a printed circuit board either to corresponding leads on another circuit board or to other electrical equipment, it is convenient to employ some sort of electrical connector. One kind of electrical connector that has been used for this purpose comprises a plurality of pre-tensioned spring clips mounted inside a slot formed in a rectangular block of insulating material, the slot being of such dimensions as to permit the edgewise insertion of a circuit board. The spring clips are disposed in such a manner that, when a circuit board is inserted into the slot, the front portions of the clips will firmly engage the terminal leads printed on the circuit board. The back portions of the spring clips are arranged to project slightly beyond the bottom surface of the insulating block so that they can be readily soldered to wire conductors extending to the particular electrical equipment to which the printed terminal leads are to be connected. Thus, by using an electrical connector of this type, a printed circuit board can be readily connected to other electrical equipment by simply inserting the circuit board into the slot in the insulating block so that the pretensioned spring clips engage the printed terminal leads. Furthermore, the circuit board can be quickly disconnected from the other equipment by merely pulling it out of the slot.

However, it has been found that the pre-tensioning of the spring clips produces mechanical resistance with respect to both the insertion and withdrawal of a circuit board thus causing considerable wear on the printed terminal leads which is objectionable for several reasons. A certain amount of wear will produce metallic particles which will be scattered over the unprinted areas of a circuit board thereby reducing the insulation resistance between the printed conductors. A greater degree of wear may cause the thin plating of precious metal to be rubbed off the terminal leads. Extreme wear might result in some of the terminal leads being removed or stripped off from a circuit board.

Attempts to avoid this objectionable wear by adjusting the pre-tensioning of the spring clips so as to reduce their mechanical resistance have not been satisfactory due to variations in the thickness of different circuit boards. These variations result from the fact that, in manufacturing the insulating panels upon which circuits are to be printed, comparatively wide thickness tolerance is ordinarily permitted. Furthermore, warpage of the circuit boards will result in excessive wear on terminal leads printed near the side and middle portions of a circuit board. This is particularly objectionable in the case of relatively wide circuit boards.

Accordingly, it is an object of this invention to provide an improved electrical connector for preformed panel circuit arrangements, such as printed circuits.

Another object of this invention is to provide an improved electrical connector for printed circuit boards which will produce no wear on terminal leads that are printed on the circuit boards.

An additional object of the invention is to provide an improved electrical connector which can be used with printed circuit boards of comparatively wide thickness tolerances without abrading their printed terminal leads.

These and other objects of the invention are attained by mounting two parallel rows of rigid, inflexible posts of electrically conductive material inside a receptacle member comprising a rectangular block of insulating material having a slot formed therein, and by affixing a plurality of resilient spring contact fingers of electrically conductive material to both sides of a printed circuit board that is to be inserted in the slot. The spring fingers are disposed upon the circuit board in such a manner that each spring finger has one end portion in engagement with a respectively different terminal lead printed on the circuit board. For the purpose of obtaining good electrical conductivity, each of these end portions is soldered to its associated terminal lead. The other portion of each spring finger is formed in an undulant or wavy shape so as to provide a protuberance or bulge. Thus, when the circuit board is inserted into the slot, the bulging portions of the spring fingers on each side of the circuit board become compressed between the two rows of inflexible posts in the slot as is explained more fully hereinafter. The resulting compressive force serves to hold the circuit board securely in the receptacle member.

These and other features of the invention are more fully discussed in connection with the following detailed description of the drawing in which.

Figure 3:
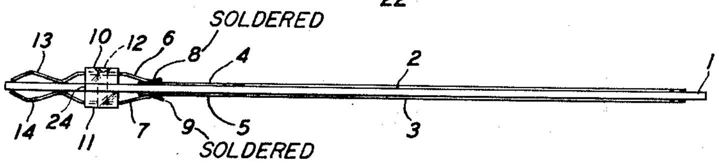
FIG. 3 is a side view of the circuit board showing the undulant shape of the spring fingers affixed thereto.
Figure 4:
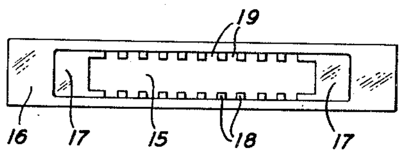
FIG. 4 is a top view of the insulating block showing the slot formed therein.
Figure 5:
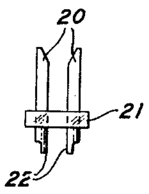
FIG. 5 is an end view of the assembly of inflexible posts shown in the lower portion of FIG. 2.
Figure 2:
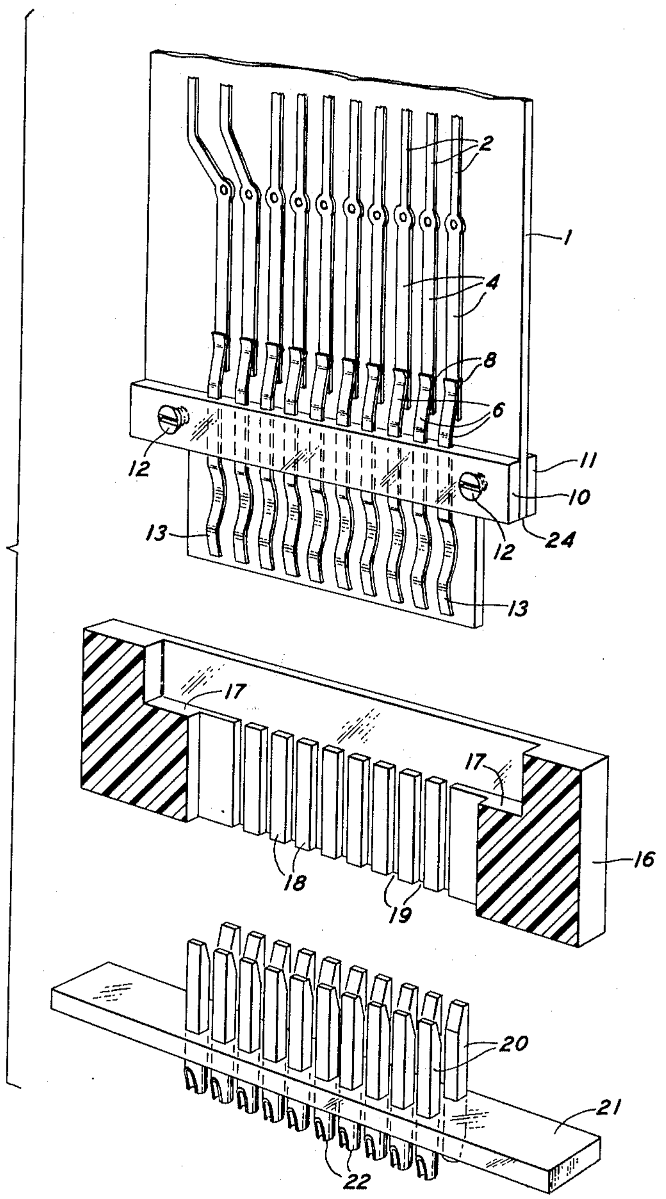
FIG. 2 is an exploded perspective view, partly in section, of the same circuit board and electrical connector.

In the drawing, a circuit board 1 of insulating material, such as phenolic material, is represented as having a first circuit pattern 2 of electrically conductive material printed on one side thereof and a second circuit pattern 3 also of electrically conductive material printed on the other side, as is indicated in FIG. 3. The circuit pattern 2 includes a first plurality of printed terminal leads 4 arranged in parallel spaced relation along the lower edge of one side of the panel 1, and the circuit pattern 3 comprises a second plurality of printed terminal leads 5 similarly disposed on the other side of the panel 1.

A first group of resilient spring contact fingers 6 of electrically conductive material are fixedly secured to one side of the circuit board 1 in parallel spaced relation in such a manner that each spring finger 6 has one end portion lying on top of and in engagement with a respectively different one of the terminal leads 4. A second group of similar spring contact fingers 7 also of electrically conductive material are fixedly secured to the other side of the panel 1 and are arranged in a corresponding manner so as to engage the other terminal leads 5. Good electrical conductivity can be obtained by soldering the spring fingers 6, 7 directly to their respectively associated terminal leads 4, 5, as is indicated by the reference numerals 8 and 9 in FIG. 3, without the necessity of applying a surface plating of precious metal to the printed terminal leads 4, 5.

The two sets of spring contact fingers 6, 7 can be affixed to the panel 1 in any suitable manner. One convenient way of doing this is to employ two strips 10 and 11 of thermosetting insulating material, such as diallyl phthalate, having the first group of spring fingers 6 molded or embedded in one strip 10 at spaced intervals and the other group of spring fingers 7 similarly retained in the other molded strip 11. These two assemblies are held firmly in place upon the panel 1 by any appropriate means, such as by rivets or by screws 12. Therefore, the insulating strips 10 and 11 serve as holding or clamping means for securely attaching the spring fingers 6, 7 to the panel 1 while maintaining their parallel spaced positions. A further advantage of this construction is that by thus fastening the strips 10 and 11 to each side of the panel 1 the rigidity and strength of the circuit board 1 are increased thereby reducing the possibility of bending or breaking the panel 1 that might otherwise occur during its insertion or withdrawal into and out of the slot in the receptacle member described hereinafter.

Due to the fact that the length of each of the spring fingers 6, 7 is considerably greater than the width of each of the insulating strips 10 and 11, only a relatively small portion of each spring finger 6, 7 is embedded in the thermoplastic material. The remaining portion of each of the spring fingers 6, 7 is formed in an undulant or wavy shape so as to provide a protuberance or bulge indicated by the reference numerals 13 and 14. It is to be noted that, since the printed terminal leads 4, 5 do not extend below the insulating strips 10 and 11, the lower ends of the spring fingers 6, 7 bear against the flat surfaces of the insulating panel 1. In order to avoid damage or distortion of the spring fingers 6, 7 that might otherwise be caused by snagging of their lower ends, the bottom edge of the panel 1 extends slightly beyond the lower ends of the spring fingers 6, 7.

As can be seen in the drawing, that part of the circuit board 1 which extends beyond the bottom edges of the strips 10 and 11 has portions cut off along its sides so that it is of less width than the upper part and thereby forms shoulders 24. These shoulders 24 serve as stops when the lower part of the circuit board 1 is inserted into a trough-like receptacle member comprising a rectangular block 16 of any suitable thermosetting insulating material having a slot 15 formed therein of such dimensions as to permit the edgewise insertion of the circuit board 1.

In one embodiment of this invention, the length of the upper portion of the slot 15 is slightly greater than the length of the strips 10 and 11 while the length of the lower portion of the slot 15 is slightly greater than the width of the lower edge of the panel 1. This difference in the dimensions of the lengths of the slot 15 results in the formation of stops or shoulders 17 for limiting the downward movement of the shoulders 24. The depth of the slot 15 from the top surface of the block 16 down to the top of the shoulder 17 is about equal to the width of one of the strips 10 or 11. The remaining depth of the slot 15 is about equal to the distance from the shoulders 24 down to the bottom edge of the panel 1. The width of the upper portion of the slot 15 is slightly greater than the distance between the outer surface of the strip 10 and the outer surface of the strip 11. This excess in both the width and lengths of the slot 15 enables it to be used with circuit boards of comparatively wide thickness tolerances and also with circuit panels that have been distorted by warpage.

The lower portion of each side wall of the slot 15 is fluted in such a manner as to form parallel ridges 18 and grooves 19, each having a rectangular cross section. This fluting begins at approximately the same level as the shoulders 17 and extends downward to the bottom of the slot 15.

Two parallel rows of inflexible posts 20 of electrically conductive material are rigidly mounted on a plate 21 of insulating material. This may be done conveniently by using a plurality of stiff metallic posts 20 and by molding or embedding their lower portions in a plate 21 of the same thermosetting material as the block 16. The ends of the posts 20 protrude or project slightly from the lower surface of the plate 21 and are scooped out so as to provide solder cups 22 in order to facilitate the making of soldered connections between the posts 20 and wire conductors extending to the particular electrical equipment to which the printed terminal leads 4, 5 are to be coupled. For the purpose of simplicity, and since their use is well understood by those skilled in the art, these wire conductors are not shown in the drawing.

In each row, the spacing between the posts 20 is equal to the spacing of the fluted grooves 19; and the distance from the outside surfaces of the posts 20 in one row to the outside surfaces of the posts 20 in the other row is equal to the distance from the grooves 19 in one side wall of the slot 15 to the grooves 19 in the other side wall of the slot 15. This dimensional equality permits the assembly of posts 20 to be inserted into the lower portion of the slot 15 with each of the posts 20 being snugly received within one of the grooves 19. It should be noted that the posts 20, after being thus received by the grooves 19, are held rigidly in alignment by the fluted ridges 18.

Figure 1:
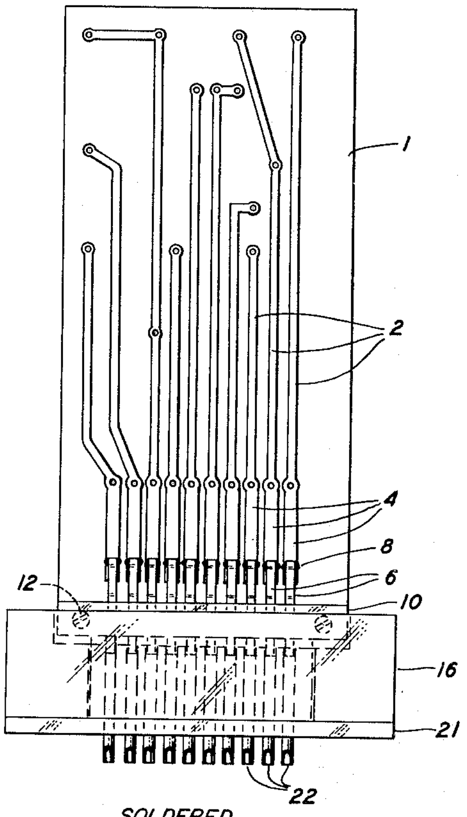
FIG. 1 is a front view of a printed circuit board and one embodiment of an electrical connector constructed in accordance with this invention.

After the posts 20 have been fully inserted into the slot 15, the upper surface of the plate 21 will be in engagement with the bottom surface of the insulating block 16 as is shown in FIG. 1. The plate 21 can then be securely fastened to the block 16 by any convenient means, such as with screws or adhesive cement.

When the assembly of posts 20 has been securely mounted inside the slot 15, the receptacle member 16 becomes ready for the insertion of the circuit board 1. In order to facilitate the initial engagement of the spring fingers 6, 7 with the posts 20, the upper ends of the posts 20 may be beveled, as is represented in the drawing, so as to function as guides for the bottom end of the circuit board 1. The tops of the fluted ridges 18 may also be beveled for this purpose if desired.

Since it is intended that the posts 20 will function as mating contacts for the spring contact fingers 6, 7, the two rows of posts 20 are spaced apart by a distance which is slightly smaller than the distance between the protuberant or bulging portions 13 of the spring fingers 6 on one side of the panel 1 and the corresponding bulging portions 14 of the spring fingers 7 on the other side of the panel 1. Therefore, when the spring fingers 6, 7 are inserted between the two rows of posts 20, their bulging or loop portions 13 and 14 become compressed and the resulting compressive force functions to hold the circuit board 1 securely in the receptacle member 16 so that it cannot fall out nor be shaken loose by vibrations.

After the circuit board 1 has been inserted into the receptacle 16, the insulating strips 10 and 11 perform the additional function of acting as a cover or plug in helping to keep dirt and dust from gathering on and around the spring contact fingers 6, 7 and their mating contact posts 20. This cover comprising the strips 10 and 11 is not intended to fit tightly in the slot 15 because, as was stated above, the dimensions of the slot are designed to be slightly larger than the corresponding dimensions of the strips 10 and 11 so as to accommodate circuit boards of relatively wide thickness tolerances and also circuit panels that have been distorted by warpage. Accordingly, in the case of a circuit board of a little more than average thickness, one of the insulating members 10 or 11 may engage a side wall of the slot 15 in the receptacle 16. If a circuit board is still thicker, both of the insulating members 10 and 11 may engage the two side walls of the slot 15 in the receptacle member 16.

It is to be understood that the embodiment of the invention that has been described above has been presented for the purpose of explaining the principles and features of operation of the invention. It is to be further understood that various modifications of this form of the invention may be made without exceeding the scope of the invention. For example, if the electrical connector of this invention is to be used with a circuit board having terminal leads printed on only one side thereof, such as the leads 4, then the insulating strip 11 and the spring contact fingers 7 may be omitted. Accordingly, it will then not be necessary to provide flutings on both side walls of the slot 15. Instead, one side wall may be smooth. Similarly, only one row of posts 20 will be required. The circuit board would then be inserted in the slot 15, which would be of suitable width, in such a manner that the blank insulating surface of the circuit board engages the smooth side wall of the slot 15 while the spring fingers 6 engage the single row of mating contact posts 20 in the manner described above.

What is claimed is:

1. A printed circuit board connector comprising a trough-like receptacle member including means defining therein a long narrow opening having a top and at least two side walls, a plurality of inflexible contact members fixedly located on said side walls and having terminations a substantial distance below the top of said opening, a printed circuit board having a plurality of terminal leads printed thereon, a plurality of undulant resilient metallic members each associated with and contacting a respectively different one of said terminal leads and having a protuberance forming a loop portion adjacent the lower edge of said board, and means for securing said resilient metallic members in position on said board, said means comprising an insulating member fastened to said board transversely across each of said metallic members, said insulating member being adapted to engage at least one of said side walls along that portion of its area extending from the top of said opening to said terminations of said inflexible contact members, whereby said loop portions of said metallic members engage said inflexible contact members when the lower edge of the circuit board is inserted in the receptacle.

2. A printed circuit board connector comprising a printed circuit board having a plurality of terminal leads printed thereon, said board having a lower end, a plurality of electrically conductive contact members located on said circuit board, each of said contact members comprising at least two ends and having one of said ends in engagement with a respectively different one of said terminal leads and having another of its ends extending nearly to the lower end of said circuit board, insulating material in strip form fastened to said circuit board and having a portion of each of said contact members embedded therein, said connector further comprising a receptacle member having means defining a slot therein, said slot having an opening therein, and a plurality of mating contact members located in said slot in position for engaging said first plurality of contact members when the lower end of said circuit board is inserted in the slot, said insulating strip material being of such dimensions that it together with the lower end of the circuit board substantially plug the opening to the slot when said first plurality of contact members is in engagement with said plurality of mating contact members.

3. A printed circuit board connector comprising a printed circuit board having an upper portion and a lower portion, the width of said upper portion being greater than the width of said lower portion, said upper portion having a bottom adjoining said lower portion, a circuit pattern having a plurality of terminal leads printed only on said upper portion of said circuit board, a first plurality of contact members located on said circuit board, each of said contact members having a part thereof extending over said upper portion of said circuit board and in engagement with a respectively different one of said terminal leads and having another part thereof extending almost to the lower edge of said lower portion of said circuit board, said connector also comprising a receptacle member having means defining a slot therein of such dimensions as to receive the lower portion of said circuit board when inserted therein, said slot having an upper portion and a lower portion, and a second plurality of contact members located in said slot and adapted to engage said first plurality of contact members when said lower portion of said circuit board is received within said slot, one of said pluralities of contact members being formed of resilient electrically conductive material and the other of said pluralities of contact members being formed of inflexible electrically conductive material, and said connector further including insulating material in strip form, and fastening means for securing said insulating strip material to only said upper portion of said circuit board with the lower edge of said insulating strip material bordering said bottom of said upper portion of said circuit board, the upper portion of said slot being enlarged with respect to the lower portion thereof for receiving therein said insulating strip material when said circuit board is inserted in said slot.

References Cited in the file of this patent

UNITED STATES PATENTS

| | | |
|---|---|---|
| 646,179 | Ireland | Mar. 27, 1900 |
| 2,317,710 | Anderson | Apr. 27, 1943 |
| 2,566,805 | Lavander | Sept. 4, 1951 |
| 2,664,552 | Ericsson et al. | Dec. 29, 1953 |
| 2,765,450 | Richardson | Oct. 2 ,1956 |
| 2,832,013 | Pedersen | Apr. 22, 1958 |

FOREIGN PATENTS

| | | |
|---|---|---|
| 684,579 | Great Britain | Dec. 17, 1952 |

OTHER REFERENCES

Circon Application Notes, Dec. 29, 1954.

Ruehlemann: "New Design in Ruggedized P-C Connectors," Electronic Industries and Tele-Tech, October 1956, pp. 62, 63, 158–162.

Winsker et al.: "Electronic Design," September 15, 1957, page 154.